United States Patent [19]

Gershenson

[11] Patent Number: 4,509,018
[45] Date of Patent: Apr. 2, 1985

[54] ASYMMETRIC SUPERCONDUCTING QUANTUM INTERFERENCE DEVICE IN A LINEAR AMPLIFIER CIRCUIT

[75] Inventor: Meir Gershenson, St. Paul, Minn.

[73] Assignee: Sperry Corporation, New York, N.Y.

[21] Appl. No.: 480,987

[22] Filed: Mar. 31, 1983

[51] Int. Cl.$^3$ .............................................. H03F 19/00
[52] U.S. Cl. .................................. 330/61 R; 307/306; 330/262
[58] Field of Search ...................... 330/60, 61 R, 61 A, 330/62, 63, 262; 307/306; 357/5

[56] References Cited

U.S. PATENT DOCUMENTS

| | | | |
|---|---|---|---|
| 3,356,960 | 12/1967 | Edwards et al. | 330/61 R |
| 4,315,255 | 2/1982 | Harris et al. | 307/306 X |
| 4,393,349 | 7/1983 | Burbank et al. | 307/306 X |

OTHER PUBLICATIONS

Beha, "Asymmetric 2–Josephson–Junction Interferometer as a Logic Gate", *Electronics Letters*, vol. 13, No. 7, Mar. 31, 1977, pp. 218–220, 307–306.

*Primary Examiner*—James B. Mullins
*Attorney, Agent, or Firm*—William C. Fuess; Kenneth T. Grace; Marshall M. Truex

[57] ABSTRACT

A superconducting quantum interference device (SQUID) is direct current biased through physical connections asymmetric to, and preferably maximally asymmetric to, the two Josephson junctions. The asymmetric SQUID so created is, responsively to such physical asymmetry, biased for operation in the linear region of the input magnetic flux/output (voltage or current) device response curve. A resistance of specified value is connected in parallel, or shunt, to the parasitic bridge capacitance of the asymmetric SQUID in order to minimize hysteresis. Two asymmetric SQUIDS of opposite asymmetry are serially connected as a push-pull linear amplifier stage which exhibits zero output (voltage or current) at zero input magnetic flux, and which is specifiable in parameters of construction so as to exhibit optimum linearity of response about such point. Plural successive such linear amplifier stages are connected by an LC filter, which filter is lowpass to the Josephson oscillation frequency, in order to form a linear amplifier entirely with the cyrogenic environment and with a bandwidth of the order to D.C. to $10^9$ Hertz.

9 Claims, 12 Drawing Figures

ASYMMETRIC SUPERCONDUCTING QUANTUM INTERFERENCE DEVICE IN A LINEAR AMPLIFIER CIRCUIT

BACKGROUND OF THE INVENTION

The present invention concerns direct current biased superconducting quantum interference devices (D.C. SQUIDs). The D.C. SQUID is an extremely sensitive magnetic flux sensor. When biased with a constant current the voltage across the SQUID is a periodic function of the applied magnetic flux, with the period being equal to one flux quantum ($\Phi_o = 2.07 \times 10^{-15}$ Weber). The prior art teaches that the two physical points at which current should be injected into the D.C. SQUID device, in order to accomplish the biasing thereof, should be symmetrical relative to the physical locations of the two Josephson junctions within the D.C. SQUID device. So biased, the D.C. SQUID has a zero magnetic flux input operating point at a minimum output (voltage or current). As magnetic flux either increases or decreases (i.e. is coupled at non-zero magnitude to the D.C. SQUID in one direction or the other) about the zero magnetic flux operating point, the output (voltage or current) increases about the minimum output (voltage or current) produced at zero magnetic flux input, such output (voltage or current) assuming a periodic function with applied magnetic flux.

In the prior art mode of operating such a symmetrically biased D.C. SQUID, a modulated signal is detected by room temperature electronics and fed back to the SQUID input to maintain an operating point near the minimum in the periodic output (voltage or current) versus input magnetic flux characteristic. Slew rate, dynamic range and system noise are limited by the room temperature electronics. All these limitations are undesirable in maximizing the time responsiveness, dynamic range, and sensitivity of the D.C. SQUID to magnetic flux. The present invention will later be seen to involve (1) the construction of asymmetrically biased D.C. SQUIDS operative to produce a linear (voltage or current) output about zero input magnetic flux, and (2) the construction of amplifiers from such asymmetric SQUIDS.

Useful in understanding the present invention are a number of parameters used to characterize SQUID behavior. The principal electrical model of a SQUID has been the RSJ model since its publication by W. C. Stewart in Appl. Phys. Lett. 12, 277 (1968) and by D. E. McCumber in J. Appl. Phys. 39, 3113 (1968).

The RSJ model treats each junction as an ideal Josephson element, $I_o$, in parallel with a resistive shunt, r, and a capacitance, C. The SQUID loop has an inductance, L. The following formulas (1) through (4) list a number of criteria these parameters must satisfy for the SQUID to function properly. Beyond these criteria, the primary figure of merit is SQUID noise, as it determines the detection limit of the SQUID.

(1) $(2\pi/\Phi_o) I_o rrC \leq 1$ (for Non-Hysteretic Josephson junctions)

(2) $(I_o \Phi_o/2\pi) >> kTI_o > 0.2$ μa (in order that the Josephson junction stay locked)

(3) $(\Phi_o^2/L) > 4kTL < 2nH$ (in order that the SQUID stay locked)

(4) $(2LI_o/\Phi_o) \simeq 1$ (so that coupled energy is evenly distributed between loop and Josephson junction)

The electrical model of the present invention will be seen to additionally recognize a parasitic bridge capacitance (k) between the two Josephson junctions. The present invention will then teach the use, and the value selection, of a resistance (R) in parallel, or shunt, relationship to such a parasitic capacitance (k). An electrical model of a SQUID shown by C. D. Tesche in the Journal of Low Temperature Physics volume 47 page 385 (1981) shows the bridge capacitance (k) and a series resistance (R), which series resistance (R) is possibly not of discrete implementation but rather only part of Tesche's electrical model for a SQUID. Whether or not Tesche's resistance (R) is of actual discrete implementation or, as seems probable, only part of his model, the present invention will teach the implementation of a discrete real resistance (R) of a specific calculated value in parallel, or shunt relationship with a parasitic capacitance (k) of the SQUID. This parallel, or shunt, resistive R is not merely part of the electrical model of the SQUID, but also a discrete physically realized entity in the preferred embodiment thin film technology in which the SQUID of the present invention is preferably implemented.

Prior art effort to build an amplifier from SQUIDS is revealed in the paper "An Integrated DC SQUID Cascade" by A. Davidson presented at the 1982 Applied Superconductivity Conference. In the words of Davidson's abstract to his conference presentation:

"We show experimentally that it is feasible to couple all the available current from one thin film dc SQUID to another on the same chip. This cascade may be one way to solve the read-out problem for the highly sensitive tunnel junction dc SQUID's that have been produced by the Josephson computer technology at IBM (and elsewhere), while preserving a large bandwidth (the order of 1 GHz). The technique involves coupling the shunt resistors of the first SQUID in the cascade to a transmission line, a filter, and the input inductance of the second SQUID. Hence the resistive shunts for the first SQUID are not directly across each junction, but are completed by an extended circuit that would ordinarily disrupt proper SQUID action. We show nonetheless that the voltage versus flux characteristic of the first stage is not affected by the coupling; that all the current is transferred; and that the signal response time is less than four nanoseconds. Parasitic phase locking between the two SQUID's has so far prevented a demonstration of low noise read-out."

The present invention is not based on coupling the shunt resistors of a SQUID.

SUMMARY OF THE INVENTION

The present invention is generally concerned with direct current biased superconducting quantum interference devices (D.C. SQUIDs), and is specifically concerned with the direct current biasing of a D.C. SQUID in a physically asymmetric manner in order that it may be, through charging the physical points at which current is injected into the device, operated in a linear portion of the output (voltage or current)/input magnetic flux curve. The invention is further specifically concerned with the creation of single and cascaded multiple stage linear amplifier circuits employing such asymmetric D.C. SQUID.

At the threshold, the present invention teaches that the current injection into a D.C. SQUID serving to bias such D.C. SQUID should be performed at asymmetrical physical locations relative to the two Josephson junctions within such D.C. SQUID. Such an asymmetrically biased D.C. SQUID is called an asymmetric SQUID. So asymmetrically biased, a different and unequal portion of the total SQUID inductance (L) will be coupled to each of the two Josephson junctions. These unequal inductances coupled to each Josephson junction are expressed as $(1-\eta)$ L/2 and $(1+\eta)$ L/2 wherein $\eta$ is not equal to zero. So asymmetrically biased, the D.C. SQUID will have a zero magnetic flux input operating point brought into the linear portion of the output (voltage or current)/input magnetic flux device response curve. The asymmetrically biased D.C. SQUID operates as a linear device. It is the first SQUID known to so operate.

The present invention firstly teaches that a preferred embodiment asymmetric SQUID is totally asymmetric. In other words, either $\eta=1$ giving total asymmetry in one direction, or sense, or else $\eta=-1$ giving total asymmetry in the opposite direction, or sense. Such totally asymmetric SQUID has one Josephson junction coupled through essentially the entire SQUID inductance (L) while the other Josephson junction couples essential negligible SQUID inductance. Physically, such a SQUID has one bias current connection which is maximally close to one Josephson junction, thereby making such same connection maximally far from the other Josephson junction.

Having obtained a SQUID biased for operation in the linear region of the input magnetic flux/output voltage by the making of physically asymmetric current biasing connections thereto, the electrical model of the present invention shows that, in actual fabrication a tank circuit with a figure of quality (Q), $Q = R\sqrt{C/L}$, will be formed by the SQUID inductance (L) and any parasitic bridge capacitance (K) introduced by the fabrication technique, such as the preferred embodiment thin film technology strip-line fabrication technique. In the face of parasitic bridge capacitance (K), a prior art electrical model for D.C. SQUIDS has been previously shown using a resistance (R) in series with such parasitic capacitance (K), which resistance (R) influences hysteretic effects. The present invention secondly teaches (in the the utilization of an asymmetric SQUID) that a real resistance (R) should be employed in parallel, or shunt, configuration with the parasitic capacitance (K) of such asymmetric SQUID in order to minimize hysteretic effects.

The present invention thirdly teaches that the value of such parallel, or shunt, resistance (R) should be chosen so that the Q of that circuit which contains parallel SQUID inductance (L), parasitic bridge capacitance (K), and resistance (R) should be equal or nearly equal to unity.

The present invention fourthly teaches that two asymmetric SQUIDS of opposite asymmetry may be coupled so that the voltage offsets of each cancel, thereby producing a single linear amplifier stage for which the combined output (current/or voltage)/input magnetic flux device response curve will pass through the point of zero magnetic flux and zero output, and will be linear about such point. Linear means that linearly decreasing flux (flux coupled to the two asymmetric SQUID linear amplifier stage in one direction) will result in linearly decreasing output (current or voltage) while linearly increasing flux (flux coupled in the opposite direction) will cause linearly increasing output (current or voltage). Such a two asymmetric SQUID linear amplifier stage is a basic building block of SQUID linear amplifier circuits.

The present invention fifthly teaches that a preferred configuration for a single linear amplifier stage is a push-pull configuration wherein both the operating point on a load line (said load line as will be taught to be capable of generation, and emplacement upon the SQUID I–V characteristics, in the electrical model of such push-pull configuration linear amplifier stage) and a parameter $\beta$ (said $\beta$ which is defined to equal $2LI_o/\Phi_o$, such terms as are defined in the specification) are selected for optimum linearity and gain. Considering first the parameter $\beta$ (defined equal to $2LI_o/\Phi_o$, of which terms L will be explained to be that quantity most susceptible of control), the present invention will fifthly teach that for each single push-pull configuration linear amplifier stage the parameter $\beta$ should equal approximately 0.6. Considering next the operating point on the load line, the present invention will fifthly teach the electrical model of the push-pull configuration linear amplifier stage (comprised of two symmetric SQUIDS) and the I–V characteristics thereof such model. When that load line, which load line will be taught to be possible generation from the electrical model, is emplaced upon the I–V characteristics, then that preferred region of electrical bias (current or voltage) to the single push-pull configuration linear amplifier stage which accords optimum linearity of amplifier output current to amplifier input current will be apparent. The fifth teaching of the present invention is thusly, in summary, how to create and optimally operate (in accordance with the electrical model thereof) a push-pull configuration linear amplifier stage comprised of two asymmetric SQUIDS of opposite asymmetry.

The present invention sixthly teaches that when plural successive such push-pull configuration linear amplifier stages (each comprised of two asymmetric SQUIDS of opposite asymmetry) are interconnected as a multiple stage amplifier circuit, then an attenuator between stages should be utilized to provide filtering of any residual internal Josephson oscillations of the SQUIDS, and to prevent phase locking of adjacent amplifier stages. The preferred embodiment attentuator is a lowpass filter constructed solely of inductors (L) and capacitors (C).

Thusly, it is a first object of the present invention that a d.c. SQUID should be asymmetrically biased in order that its operation may be brought into the linear portion of the output (voltage or current)/input magnetic flux SQUID device response curve.

It is a second object of the present invention that an asymmetric SQUID should be maximally totally asymmetric, which property will prove beneficent when two such totally asymmetric SQUIDS (of opposite asymmetry) are interconnected as a linear amplifier and particularly as an optimally linear push-pull configuration linear amplifier stage.

It is a third object of the present invention that a resistance (R) should be employed in parallel, or shunt, with the inductance (L) and parasitic bridge capacitance (K) of an asymmetric SQUID in order to minimize hysteretic effects.

It is a fourth object of the present invention that the parallel, or shunt, resistance (R) utilized in minimizing the hysteretic effects of an asymmetric SQUID should optimally be of that value which produces a figure of quality Q, $Q = R\sqrt{C/L}$, for the tank circuit formed by such asymmetric SQUID equal to unity.

It is a fifth object of the present invention that two asymmetric SQUIDS of opposite asymmetry should be interconnected to produce a single linear amplifier stage for which the output (current or voltage)/input magnetic flux response curve is linear about the point of zero input magnetic flux producing zero output (current or voltage).

It is a sixth object of the present invention that a push-pull configuration single linear amplifier stage, comprised of two asymmetric SQUIDS of opposite asymmetry, should be constructed in accordance with the solution of simultaneous differential equations appropriate to the electrical model of such amplifier stage, and thereby the construction (in accordance with the solution to the simultaneous differential equations based on the model) should exhibit certain parameterization, which parameterization establishes an operating point plus optimum linearity of gain about such operating point. In other words, it is the sixth object of the present invention that the utilization of asymmetric SQUIDS of opposite asymmetry in the creation of a push-pull configuration amplifier stage of predictable linearity and gain should be well understood for being based on an electrical model.

It is the seventh object of the present invention that the coupling of plural SQUID linear amplifier stages should be realized in order that a stable, non-oscillatory, amplifier circuit of a plurality of stages may result, such amplifier circuit as does entirely within the cryogenic environment that amplification previously done—with adverse effects upon the slew rate, dynamic range, and noise of a SQUID system—by room temperature electronics.

DESCRIPTION OF THE PREFERRED EMBODIMENT

Figure 1A:
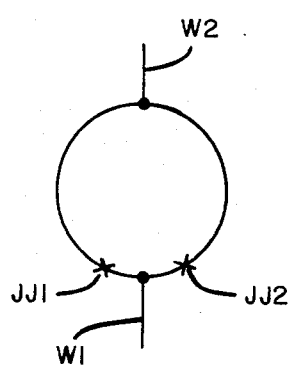
FIG. 1a shows the prior art electrical schematic representation of a D.C. SQUID.
Figure 1B:
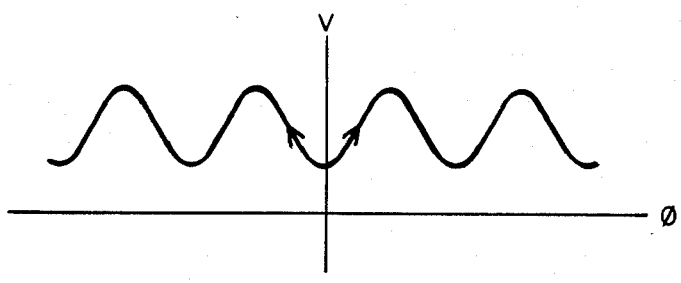
FIG. 1b shows the prior art output (voltage) as a periodic function of applied magnetic flux when the D.C. SQUID schematically represented in FIG. 1a is biased with a constant current.

The D.C. SQUID is an extremely sensitive magnetic flux sensor. The electrical schematic of a D.C. SQUID is shown in FIG. 1a. Such representation indicates the physical interconnection of the bias current connective lead wires, or lands, W1 and W2 to such SQUID: these physical connections are each equidistant from, or symmetrical to, the two Josephson junctions JJ1 and JJ2. When biased with a constant current, the voltage across the SQUID is a periodic function of the applied magnetic flux, with the period being equal to one flux quantum ($\Phi_0 = 2.07 \times 10^{-15}$ Weber). The output,—which can be taken as voltage or converted in a resistance to current, ergo output (voltage or current)—of such a D.C. SQUID biased with a constant current applied via a symmetrical interconnection is a periodic function of applied magnetic flux. This output (voltage or current) versus input magnetic flux is shown in FIG. 1b. Such input magnetic flux is applied to the loop structure of the SQUID via coupling coils which are not shown. Output (voltage or current) for no input magnetic flux is at a minimum. Increasing magnetic flux, which is coupled to the SQUID in either direction, will initially cause an increase in the SQUID output (voltage or current) as illustrated by the arrows superimposed on the output (voltage or current)/input magnetic flux curve of FIG. 1b.

In the conventional mode of operation, a modulated signal is detected by room temperature electronics and fed back to the SQUID input to maintain an operating point near minimum in the periodic voltage-flux characteristic. Slew rate, dynamic range and system noise are limited by the room temperature electronics. These considerations have motivated the present invention of a cascaded linear SQUID amplifier, which has a bandwidth on the order of D.C. to $10^9$ Hertz.

Figure 2A:
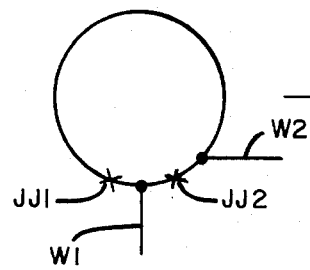
FIG. 2a shows an electrical schematic representation of an asymmetrically biased D.C. SQUID.

The threshold essential element in the creation of a linear SQUID amplifier is a D.C. SQUID operated in the linear region of the output (voltage or current)/input magnetic flux device response curve. Such a D.C. SQUID based for operation in the linear region is created by connecting the direct current bias to a D.C. SQUID in a physically asymmetric manner. The electrical schematic symbol for such an asymmetric SQUID is shown in FIG. 2a, which symbol implies that at least one of the bias current connections thereto such SQUID is not equidistant between the two Josephson junctions JJ1 and JJ2 and is not symmetrical to such Josephson junctions. This is in fact the case. Normally the Josephson junctions of a D.C. SQUID are very close together. Connective lead W1 connects to such Josephson junctions within the physically small space between them. Connective lead W2 of the asymmetric SQUID schematically represented in FIG. 2a is electrically connected on the other side of both Josephson junctions from lead W1, and is closer to one of such Josephson junctions than the other (Josephson junction JJ2 in FIG. 2a). It will later be seen that the preferred embodiment asymmetric SQUID will be totally asymmetric, meaning the second connective lead (lead W2 in FIG. 2a) is connected as closely on the other side of one Josephson junction (Josephson jucntion JJ2 in FIG. 2a) as is physically possible, thusly being as far from the other Josephson junction (Josephson junction JJ1 in FIG. 2a) as is physically possible.

Figure 2B:
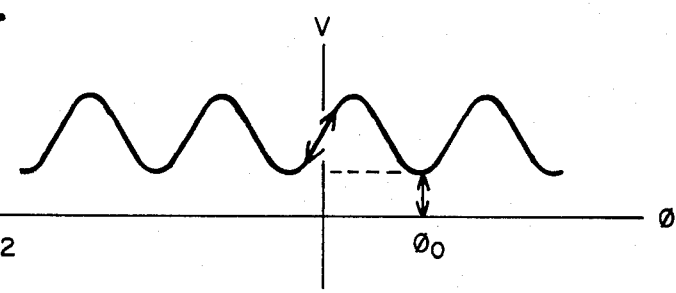
FIG. 2b shows the output (voltage) as a periodic function of applied magnetic flux when the asymmetric D.C. SQUID schematically represented in FIG. 2a is biased with a constant direct current.

The output (voltage or current)/input magnetic flux response curve for an asymmetric SQUID is shown in FIG. 2b. The zero input magnetic flux operating point produces a non-zero output (voltage or current), and increasing magnetic flux in one direction will cause such (voltage or current) output to decrease while increasing magnetic flux in the opposite direction will cause such (voltage or current) output to increase. This response is represented by the arrows in FIG. 2b.

Figure 3A:
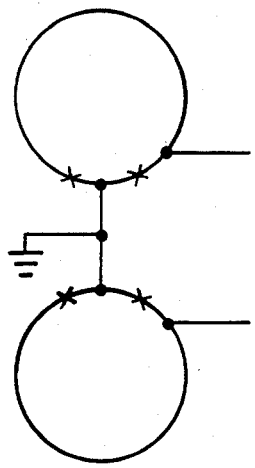
FIG. 3a shows the electrical schematic representation of two asymmetric SQUIDS of opposite asymmetry coupled back-to-back as a rudimentary linear amplifier stage.
Figure 3B:
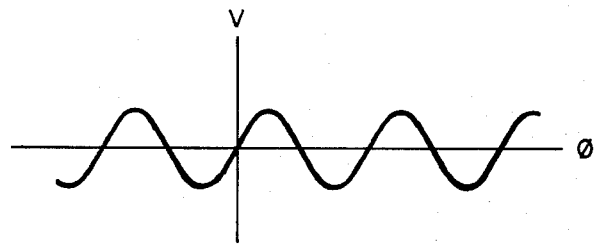
FIG. 3b shows the output (voltage) as a periodic function of applied magnetic flux when the two coupled asymmetric SQUIDS of opposite asymmetry schematically represented in FIG. 3a are biased with a constant direct current.

The electrical schematic representation of the interconnection of two asymmetric SQUIDS of opposite asymmetry is shown in FIG. 3a. Such an interconnection operates as a rudimentary linear amplifier stage, wherein the voltage offsets of each asymmetric SQUID cancel, producing the combined output (voltage or current)/input magnetic flux response curve shown in FIG. 3b. Note that the response is linear about the point of zero input magnetic flux which produces zero output (voltage or current).

Figure 4:
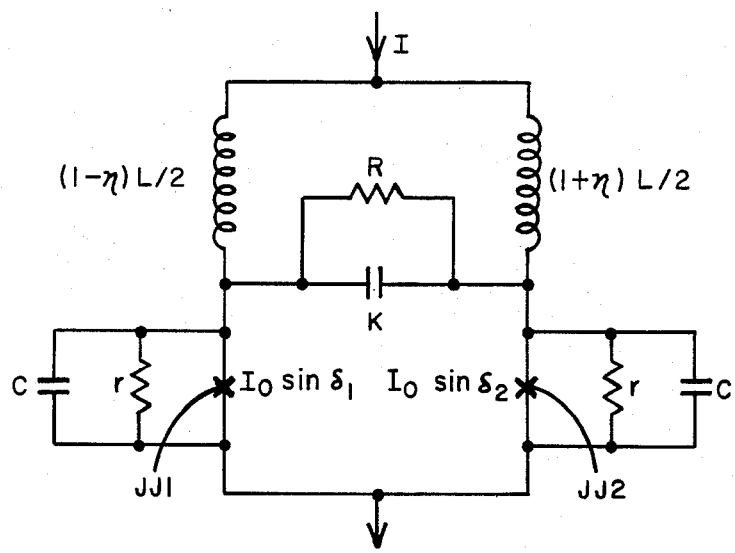
FIG. 4 shows the electrical circuit model of a single asymmetric D.C. SQUID.

Understanding of the detail design and application of an asymmetric SQUID is best obtained through an electrical model of such asymmetric SQUID. Such an electrical model of an asymmetric SQUID, based on the conventional electrical model for a SQUID as used in:

J. M. Jaycox and M. B. Ketchen, IEEE Trans. *MAG-17*, 400 (1981) [hereinafter reference 1], C. D. Tesche and J. Clark, J. Low Temp. Phys. 29, 301 (1977) [hereinafter reference 2], and C. D. Tesche, J. Low Temp. Phys. 47, 385 (1981) [hereinafter reference 3], is shown in FIG. 4. This electrical model for an asymmetric SQUID contains two Josephson junctions, each shunted by a resistor r and a capacitor C, as shown in FIG. 4. The junctions are coupled through the SQUID inductance, which is divided into two portions $(1+\eta)L/2$ and $(1-\eta)L/2$ by the current bias line I. In practice the parameter $\eta$ can be varied; $\eta=0$ is the symmetric SQUID configuration, while $\eta=\pm 1$ are the totally asymmetric SQUID configurations. The preferred embodiment method of fabricating D.C. SQUIDS is in thin film technology as taught in reference 1. The strip line techniques of thin film technology which are used to minimize stray inductance also introduce the parasitic bridge capacitance K, which couples the Josephson junctions JJ1 and JJ2 in FIG. 4. Hysteretic effects introduced by this capacitance K are minimized by the shunt resistor R. The Josephson junctions have critical currents $I_o \sin \delta_1$ and $I_o \sin \delta_2$, where $\delta$ is the phase shift across the junction. As input flux $\Phi$ is inductively coupled into the SQUID.

Numerical simulations of SQUID circuit models similar to FIG. 4 have been discussed in the literature. The notation of references 2 and 3 is utilized in the following differential equalitons describing the SQUID model:

$$(\beta_C + \beta_K)\ddot{\delta}_1 - \beta_K\ddot{\delta}_2 + 1 + \nu)\dot{\delta}_1 - \nu\dot{\delta}_2 + \qquad \text{Eq. (1)}$$

$$\frac{1}{\pi\beta}(\delta_1 - \delta_2 - 2\pi\overline{\Phi}) = i/2 - \sin\delta_1$$

$$(\beta_C + \beta_K)\ddot{\delta}_2 - \beta_K\ddot{\delta}_1 + (1 + \nu)\dot{\delta}_2 - \nu\dot{\delta}_1 - $$

$$\frac{1}{\pi\beta}(\delta_1 - \delta_2 - 2\pi\overline{\Phi}) = i/2 - \sin\delta_2$$

where
$\nu = r/R$
$\beta = 2LI_o/\Phi_o$
$\beta_L = 2\pi I_o r^2 C/\Phi_o$
$\beta_K = 2\pi I_o r^2 K/\Phi_o$
and $$\overline{\Phi} = \Phi + \beta\eta i/4. \qquad (2)$$

Equation (1) is written in normalized units: bias current, i, in units of $I_o$; flux $\Phi$ in units of $\Phi_o$; and time in units of $\Phi_o/2\pi r I_o$. The voltage across the SQUID (in units of $I_o r$) is given by:

$$V = (1+\eta)\dot{\delta}_1/2 + (1-\eta)\dot{\delta}_2/2. \qquad \text{Eq. (3)}$$

Typically Eqs. (1)–(3) are solved numerically for the voltage at a constant bias current. The output voltage oscillates in time, and the time averaged voltage is equal to the normalized angular frequency of the oscillation.

The electrical performance of the asymmetric SQUID may be simulated, and the asymmetric SQUID model differential equations have been solved numerically over a range of parameter values. The range of circuit component values is determined by fabrication constraints. Specific values are chosen to optimize amplifier performance as determined by the simulations. Typical values are $I_o \sim 10$ μamp, $L \sim 0.1$ nanohenry, $r \sim 3\Omega$, $C \sim 1$ pF, $K \sim 3$ pF, corresponding to $\beta \sim 1$, $\beta C \sim 0.25$, and $\beta K \sim 1.5$. Of these values, $I_o$ is chosen to obtain correct biasing of the SQUID. The capacitance C of the Josephson junctions is parasitic, and is usually determined only by the size of the junctions which is typically only 50 to 70 angstroms in thickness and 5 μm × 5 μm in area as created by lithographic processes. The parasitic capacitance K is a function of the technology of implementation, herein thin film strip line.

The Josephson oscillations in the SQUID occur at frequencies on the order of $f_o = I_o r/\Phi_o \sim 15$ gigahertz. In initial simulations without the shunt resistor R, it was found that the current-voltage curves were highly hysteretic. This behavior occurs because the Josephson oscillation frequency is close to the L-K tank circuit resonance frequency ($=f_o/\pi\beta\beta_K$). In this case the underdamped tank circuit is driven by the Josephson oscillations. The hysteresis is removed when the parallel or shunt, resistor R is added. The optimum value of parallel, or short resistance R is chosen to reduce the Q of the parallel L-K-R circuit to unity. The desired Q of unity is achieved by choosing $\nu = \beta K/\pi\beta$.

Specifically, in choosing the parallel, or shunt, resistance (R) for the preferred embodiment implementation of an asymmetric SQUID, the following calculations are employed.

$$Q = R \cdot \sqrt{\frac{K}{L}}$$

$$I = R \cdot \sqrt{\frac{K}{L}}$$

$$R = \sqrt{\frac{L}{K}}$$

$$= \sqrt{\frac{1 \times 10^{-9} \text{ henrys}}{3 \times 10^{-12} \text{ farads}}}$$

$$\simeq 5.8 \text{ ohms}$$

Note that the quantity "K" utilized in the calculation of the value of the parallel or shunt, resistance "R" is the capacitance of the tank circuit, or the parasitic capacitance (K) equal to approximately 3 pF in the preferred embodiment, thin film strip line, implementation of the asymmetric SQUID.

Figure 5:
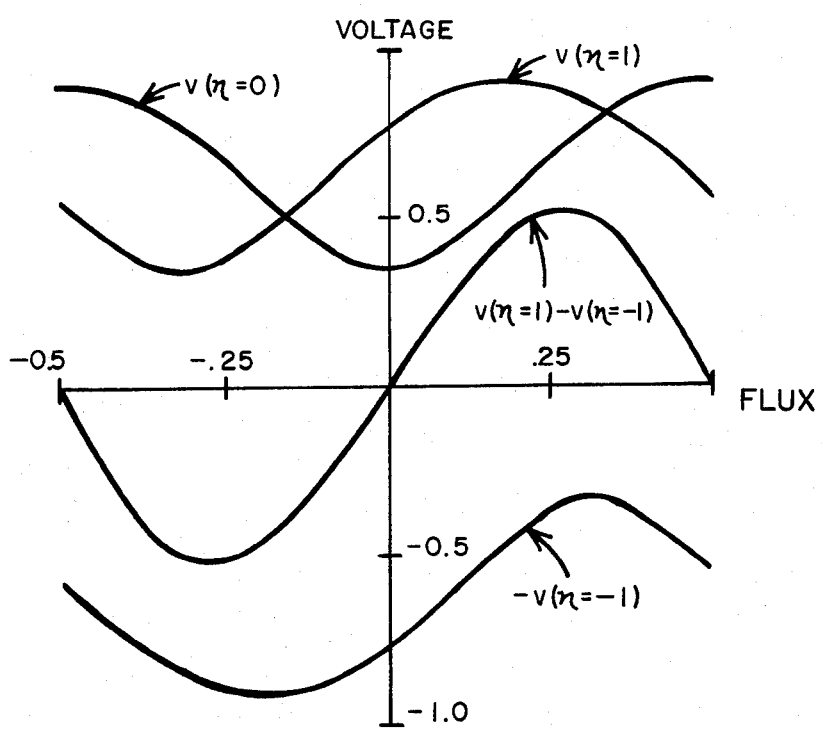
FIG. 5 shows one period of output (voltage) with applied magnetic flux for a direct current biased D.C. SQUID, for a totally asymmetric SQUID of the opposite asymmetry, and for the combination of two asymmetric SQUIDS of opposite asymetry—all such SQUIDS as are of one particular parameteritzation of construction.

Continuing to FIG. 5, one period of time average output (voltage or current) is plotted (as voltage) versus applied (input) magnetix flux in FIG. 5 for a symmetric SQUID ($\mu=0$), for a totally asymmetric SQUID of one asymmetry ($\mu=+1$), for a totally asymmetrix SQUID of the opposite asymmetry ($\mu=-1$), and for the combination of two totally asymmetric SQUIDS of opposite asymmetry. The construction parameters of all SQUIDS, for which the time averaged voltage is plotted as a function of input flux for a fixed bias current, are: $\beta=0.6$, $\beta_C=0.25$, $\beta_K=1.5$, Q=1.0, i=2.1. The numerical solutions to the differential equations were found using a fourth order Range-Kutta integration routine which was continued for each point on the curve until stable steady state time waveforms were obtained. The normalized voltage was taken as the angular frequency of the steady state time waveforms.

Interpreting the solutions to the differential equations expressed as curves in FIG. 5, the symmetric SQUID ($\eta=0$) output voltage is periodic in applied flux with the minimum voltage occuring at $2n\pi$, where n is an integer. In particular the voltage minimum occurs at zero applied flux. From Eq. (2) it is seen that for fixed bias current a nonzero $\eta$ translates the voltage-flux curve along the horizontal flux axis. Thus the values of $\eta$ and $\beta$ can be chosen so that the voltage-flux curve is linear around zero flux. This concept is central to operation of the linear amplifier. FIG. 5 shows voltage versus flux for $\eta=\pm1$, and the difference between these curves. The difference curve is linear in flux and passes through zero voltage when the applied flux is zero. This curve corresponds to the open circuit output voltage of the amplifier stage discussed below.

Figure 6:
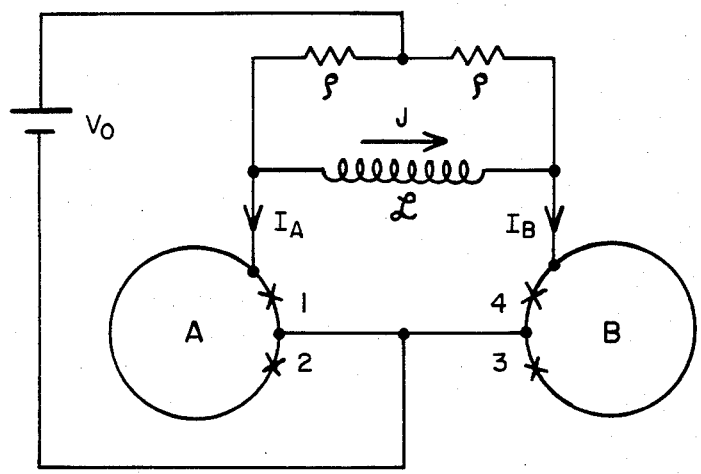
FIG. 6 shows the electrical model of a single stage linear amplifier achieved by placing two asymmetric SQUIDS of opposite asymmetry in a push-pull configuration interconnection.

Linear amplification using asymmetric SQUIDS is next considered. Linear amplification is achieved by placing asymmetric SQUIDS of opposite asymmetry in the push-pull configuration as shown schematically in the electrical model of FIG. 6. The detailed model of the SQUIDS (shown in FIG. 4) is omitted in this figure for clarity. The input flux is coupled into the $\eta=1$ (side A) and $\eta=-1$ (side B) SQUIDS. The output current, J, is proportional to the difference in the SQUID currents $I_b-I_A$, which is in turn linear in the applied flux for an appropriate choice of the parameter $\beta$. Since the output is inductively coupled to the next stage of the amplifier, the amplifier gain is proportional of the number of turns in the inductor L.

The amplifier differential equations are obtained by writing the SQUID equations, Eq. (1), for junctions 1 and 2 with $\eta=1$ and $i=i_A$, and for junctions 3 and 4 with $\eta=-1$ and $i=i_B$. The SQUID currents are given by:

$$i_A = \Gamma(V_o - V_A) - j \quad i_B = \Gamma(V_o - V_B) + j \quad \text{Eq. (4)}$$

where $\Gamma=r/\beta$, $V_o$ is the applied voltage, $V_A=\delta_1$, $V_B=\delta_4$, and normalized units are implied. The output current is related to the phase shifts by flux conservation: $j=(\delta_1-\delta_4)/\beta_o$, where $\beta_o=2LI_o/\Phi_o$. The resulting set of four coupled second order equations may be solved numerically in special cases.

Alternatively, it may be noted that if the inductance is large, the a.c. fluctuations in the current j will be small, and j may be replaced by its average value in Eq. (4). In addition, since $\Gamma$ is small the terms in $V_A$ and $V_B$ contribute negligibly to the SQUID differential equations. It is therefore proper to solve the two sets of SQUID equations for constant current, and treat Eq. (4) as a pair of load lines on the SQUID I-V characteristics. Since the inductance is superconducting, the d.c. voltage levels of the two SQUIDS are equal, and the load lines are given by Eq. (4) with $V_A$ and $V_B$ equal to the SQUID voltage. For a fixed SQUID voltage, the current, j, is given by $(i_B-i_A)/2$.

Figure 7:
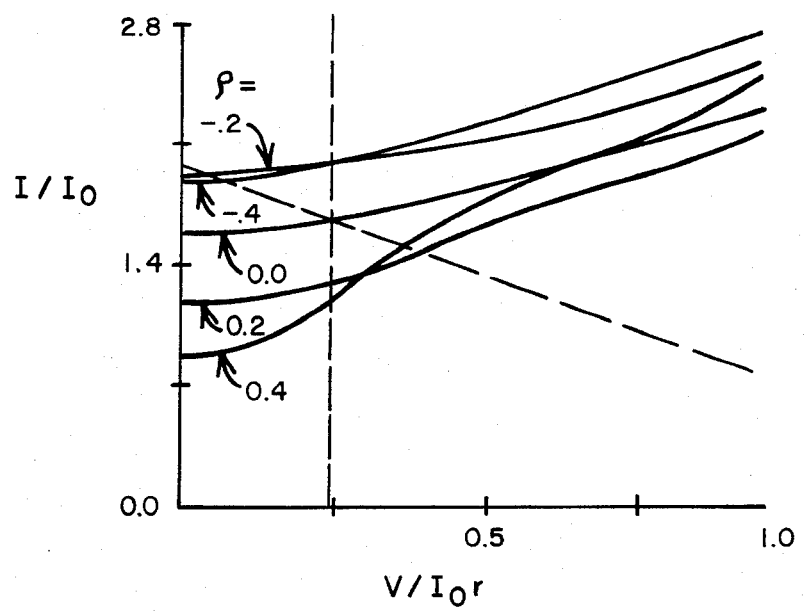
FIG. 7 shows the current/voltage (I/V) characteristics of an asymmetric SQUID of one particular parameterization of construction for five selected values of applied magnetic flux, and also shows load lines impressed upon such I/V characteristics.

The I-V characteristics for the two SQUIDS are plotted for five selected values of applied flux in FIG. 7. The parameters of construction of those asymmetric SQUIDS of opposite asymmetry coupled as a linear amplifier are: $\beta 320.6$, $\beta_C=0.25$, $\beta_K=1.5$, Q=1.0. For clarity only a few curves, corresponding to a few values of applied flux, are shown. The characteristics shown in FIG. 7 use the fact that for fixed current the $\eta=-1$I-V curves are simply the $\eta=1$ curves with $\Phi \rightarrow -\Phi$. Thus the amplifier output current for a given flux is just half the difference of the $-\Phi$ and $+\Phi$ SQUID currents at constant SQUID voltage. The load line shown in FIG. 7 is the average of $i_A$ and $i_B$, and passes through the vertical constant voltage line at the zero flux (and zero j) I-V curve. The current intercept is $\Gamma V_o$, and the voltage intercept is $V_o$.

Figure 8:
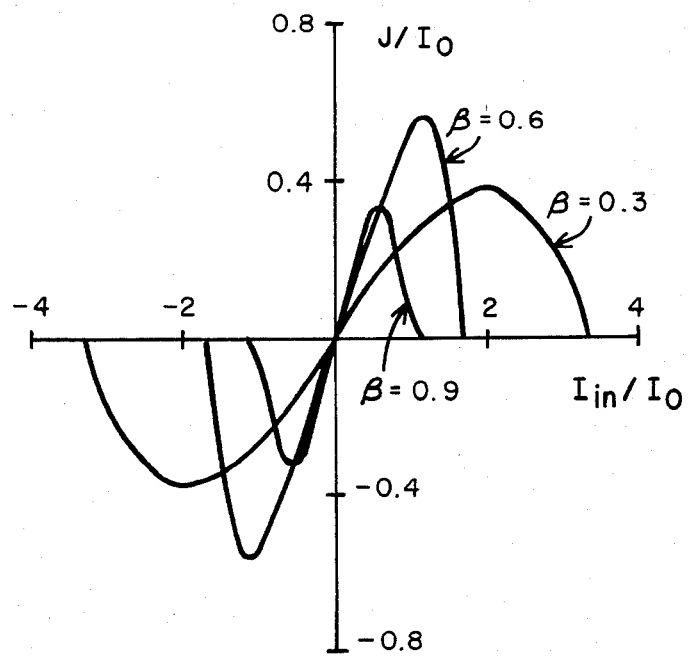
FIG. 8 shows the output current versus the input current, for that single stage push-pull configuration linear amplifier for which the electrical model is shown in FIG. 6, upon three alternate parameterizations of the construction of the asymmetric SQUIDS contained in such linear amplifier.

Both the operating point on the load line and the parameter $\beta$ are chosen to optimize linearity. In FIG. 8, the single stage amplifier output current, as determined by the load line analysis, is plotted as a function of input current ($i_{in}=2\Phi/\beta$) for a single turn. The gain of the stage is determined by multiplying the output current by the number of turns in the output coil. The value of $\beta=0.6$ has been selcted for optimum linearity and gain. The other parameters of construction ($\beta$ is the parameter which is varied between the three curves in FIG. 8) of the asymmetric SQUIDS coupled as an amplifier for which the output current is plotted versus the input current in FIG. 8 are: $\beta_C=0.25$, $\beta_K=1.5$, Q=1.0.

Figure 9:
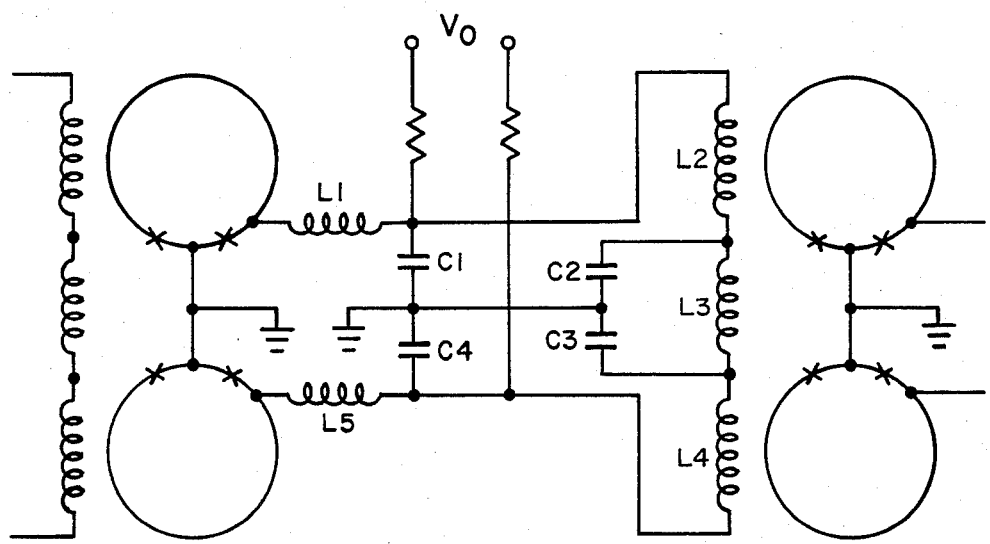
FIG. 9 shows the electrical schematic of two adjacent stages of the preferred embodiment linear amplifier wherein each stage is a push-pull configuration linear amplifier for which the electrical model was shown in FIG. 6, and wherein attenuating coupling between stages is via inductors and capacitors acting as a lowpass filter.

The preferred embodiment final, multistage, linear amplifier design will now be shown. A single pair of stages of the linear amplifier is schematically shown in detail in FIG. 9. In full numerical simulations of that amplifier shown in FIG. 6, it was found that the output current differed slightly from the results of the load-line calculations. This is due to the presence of oscillations in the simulated SQUID currents which were as large as 10% of the d.c. level (when $\beta_o$ was $50\beta$). The large inductors L2 and L4 adjacent to the SQUIDS in FIG. 9 damp the oscillations and provide nearly constant SQUID bias currents. This ensures that the load line analysis is accurate. The additional inductors and capacitors shown in FIG. 9 provide filtering of any residual Josephson oscillations, and prevent phase locking of adjacent amplifier stages.

The coupling of successive stages of the linear amplifier through successive pairs of inductors and capacitors (i.e. L1 and C1, L2 and C2) really represents a lowpass filter, meaning a filter which has a pass bandwidth which strongly attenuates the Josephson oscillations of each SQUID and linear amplifier stage. Therefore, to the Josephson oscillation frequency this filter is a very strong attenuator. To see why each pair of L and C within FIG. 9 really comprise a cascaded LC lowpass filter, it may be useful for reader to redraw the multistage linear amplifier shown in FIG. 9 in a linear manner. In such a redrawing, L1 (which L1 connects through C1 to ground) is connected to L2 (which L2 connects through C2 to ground) which is connected to L3 (which L3 connects through C3 to ground) which is connected to L4 (which L4 connects through C4 to ground) which is connected to L5. So redrawn, it is easy to see that the preferred embodiment coupling between the linear amplifier stages is merely an LC lowpass filter, that is: an attenuator to the Josephson oscillations consisting entirely of capacitors and inductors.

The manner of the component selection for the preferred embodiment LC lowpass filter connection between successive stages of that linear amplifier made from asymmetric SQUIDS shown in FIG. 9 will next be discussed. The frequency of operation of each amplifier stage is given by Josephson's frequency relationship $f = V/\Phi_o 2\pi$ wherein $\Phi_o = 1$ $\mu$volt/488 MHz is the Josephson constant. For the present apparatus, the operating point of the linear amplifier is chosen from FIG. 7 to be 7.5 $\mu$volt. By calculating the Josephson frequency from these values, it may be determined to be 3.75 GHz. In creation of a lowpass filter to this 3.75 GHz Josephson oscillation, the nominal pass band of an LC lowpass filter is considered to be d.c. to 1/10 of this Josephson oscillation, or 375 MHz. Under the normal frequency relationship for an LC circuit, $f = \frac{1}{2}\pi$ LC. When the coupling coils L2 and C4 shown in FIG. 9 are ten (10) turns each (giving a gain of ten (10) between successive linear amplifier stages) then the inductance of each is approximately one hundred times (100×) the inductance L of each SQUID. Recalling that the inductance L of each SQUID equals 0.1 nanohenry, the equal inductances of each of L1 through L5 shown in FIG. 9 is nominally equal to 10 nanohenrys. Utilizing this value of L=10 nanohenrys and a frequency f=375 MHz, it may be calculated that each of the equal capacitances C1 through C4 shown in FIG. 9 equals approximately 11.3 nanofarads. All these values are readily realizable in thin film technology, essentially by controlling the dimensions of metallization layers and the separation between such layers.

Other variations in the creation of asymmetric SQUIDS, and the construction of linear amplifier stages therefrom, and the connection of plural successive such stages will suggest themselves to those of skill in the art upon reading the above description. Therefore the following claims should be interpreted to include those equivalent realizations which are apparent from the above description and common techniques in the electrical arts for creating amplifiers from elements producing a linear response, and for creating filters of desired bandpass characteristics between stages of such amplifiers.

What is claimed is:

1. A linear amplifier comprising:
    a first superconducting quantum interference device with non-hysteretic Josephson Junctions asymmetrically interconnected for the application of direct current bias thereto; and
    a second superconducting quantum interference device also with non-hysteretic Josephson Junctions asymmetrically interconnected for the application of said direct current bias thereto at an opposite asymmetry to said interconnected first superconducting quantum interference device connected to said first superconducting quantum interference device;
    wherein said asymmetrically interconnected first superconducting quantum interference device which is connected to said asymmetrically second superconducting quantum interference device of opposite asymmetry combinatorially results in a combined voltage output response which is of equal deviation about zero voltage output with input applied magnetic flux.

2. The linear amplifier of claim 1 wherein said first superconducting quantum interference device is totally asymmetrically interconnected for the application of direct current bias thereto;
    thereby said second superconducting quantum interference device being of opposite asymmetry is also totally asymmetric;
    whereby said totally asymmetrically interconnected first superconducting quantum interference device is connected to said totally asymmetrically interconnected second superconducting interference device of opposite asymmetry results in a combined voltage output response which passes through the point of zero output voltage at zero input applied magnetic flux, and which said response is optimally linear in the region about said point.

3. The linear amplifier of claim 2 wherein each of said asymmetrically interconnected first superconducting quantum interference device and said asymmetrically interconnected at an opposite asymmetry second superconducting quantum interference device further comprise:
    a bridge resistance connecting the two non-hysteretic Josephson Junctions of said superconducting quantum interference device;
    whereby said bridge resistance serves to diminish hysteresis effects within each said superconducting quantum interference device.

4. The linear amplifier of claim 3 wherein said bridge resistance further comprises:
    a bridge resistance of the value $\sqrt{L/K}$ ohms wherein L is the inductance of said superconducting quantum interference device and K is the parasitic bridge capacitance of said superconducting quantum interference device;
    whereby said bridge resistance is thusly of the value which optimally serves to diminish hysteresis effects within each said superconducting quantum interference device.

5. The linear amplifier of claim 2 wherein the parameter of construction $\beta = 2LI_o/\Phi_o$—where $\Phi_o$ is the Josephson constant equalling $2.07 \times 10^{-15}$ Weber, where $I_o$ is the bias current in amperes, and where L is the inductance of each SQUID in henries—has a value of approximately 0.6 for each of said first and said second superconducting quantum interference devices.

6. The linear amplifier of claim 1 wherein each of said asymmetrically interconnected first superconducting quantum interference device and said asymmetrically interconnected at an opposite asymmetry second superconducting quantum interference device further comprise:
   a bridge resistance connecting the two non-hysteretic Josephson junctions of said superconducting quantum interference device;
   whereby said bridge resistance serves to diminish hysteresis effects within each said superconducting quantum interference device.

7. The linear amplifier of claim 6 wherein said bridge resistance further comprises:
   a bridge resistance of the value $\sqrt{L/K}$ ohms wherein L is the inductance of said superconducting quantum interference device and K is the parasitic bridge capacitance of said superconducting quantum interference device;
   whereby said bridge resistance is thusly of the value which optimally serves to diminish hysteresis effects within each said superconducting quantum interference device.

8. An amplifier of a plurality of stages comprising:
   a plurality of push-pull configuration linear amplifier stages each comprising
      a first superconducting quantum interference device including two non-hysteretic Josephson Junctions asymmetrically interconnected for the application of direct bias current thereto, series connected to
      a second superconducting quantum interference device also including two non-hysteretic Josephson Junctions asymmetrically interconnected for the application of said direct current bias thereto at an opposite asymmetry to said first superconducting quantum interference device; and
   a plurality of attenuator connective means for connecting successive ones of said plurality of push-pull configuration linear amplifier stages wherein each of said plurality of attentuator connective means does attenuate the Josephson oscillation frequency of said first or said second superconducting quantum interference device.

9. The amplifier of claim 8 wherein each said plurality of attenuator connective means further comprises:
   a lowpass filter constructed of capacitors and inductors which is strongly attentuating to the Josephson oscillation frequency of said first or said second superconducting quantum interference device while providing direct current coupling between successive ones of said plurality of push-pull configuration linear amplifier stages.

* * * * *